United States Patent
Garwood et al.

(10) Patent No.: US 10,422,841 B2
(45) Date of Patent: Sep. 24, 2019

(54) SYSTEMS AND METHODS FOR DESIGNING MULTIDIMENSIONAL SELECTIVE ADIABATIC PULSES

(71) Applicant: REGENTS OF THE UNIVERSITY OF MINNESOTA, Minneapolis, MN (US)

(72) Inventors: Michael Garwood, Minneapolis, MN (US); Woo Ju Albert Jang, Minneapolis, MN (US)

(73) Assignee: Regents of the University of Minnesota, Minneapolis, MN (US)

(*) Notice: Subject to any disclaimer, the term of this patent is extended or adjusted under 35 U.S.C. 154(b) by 128 days.

(21) Appl. No.: 15/493,959

(22) Filed: Apr. 21, 2017

(65) Prior Publication Data
US 2017/0307708 A1    Oct. 26, 2017

Related U.S. Application Data

(60) Provisional application No. 62/325,816, filed on Apr. 21, 2016.

(51) Int. Cl.
| G01R 33/483 | (2006.01) |
| G01R 33/46 | (2006.01) |
| G01R 33/56 | (2006.01) |
| G01R 33/565 | (2006.01) |

(52) U.S. Cl.
CPC ...... *G01R 33/4836* (2013.01); *G01R 33/4616* (2013.01); *G01R 33/5602* (2013.01); *G01R 33/5659* (2013.01)

(58) Field of Classification Search
CPC ............ G01R 33/4836; G01R 33/4616; G01R 33/5602; G01R 33/5659
See application file for complete search history.

(56) References Cited

U.S. PATENT DOCUMENTS

| 4,431,968 | A | * | 2/1984 | Edelstein | ........... G01R 33/4822 324/309 |
| 4,471,306 | A | * | 9/1984 | Edelstein | ......... G01R 33/56563 324/309 |
| 4,599,565 | A | * | 7/1986 | Hoenninger | ........... G01N 24/08 324/309 |
| 4,602,214 | A | * | 7/1986 | Edelstein | ............. G01R 33/482 324/309 |
| 5,189,371 | A |   | 2/1993 | Conolly et al. | |
| 5,278,501 | A | * | 1/1994 | Guilfoyle | ........... G01R 33/4816 324/300 |
| 5,677,628 | A | * | 10/1997 | Watanabe | .......... G01R 33/4833 324/307 |

(Continued)

OTHER PUBLICATIONS

Conolly et al., Two-Dimensional Selective Adiabatic Pulses, Magnetic Resonance in Medicine 24, 302-313 (1992). 12 pages.

*Primary Examiner* — Dixomara Vargas
(74) *Attorney, Agent, or Firm* — Quarles & Brady LLP

(57) ABSTRACT

Described here are systems and methods for designing and implementing spatially selective, multidimensional adiabatic radio frequency ("RF") pulses for use in magnetic resonance imaging ("MRI"). Spatially selective inversion can be achieved adiabatically in both two-dimensional ("2D") and three-dimensional ("3D") regions-of-interest. The multidimensional adiabatic pulses are generally designed using sub-pulses that are adiabatically driven using a parent adiabatic pulse.

12 Claims, 11 Drawing Sheets

(56) References Cited

U.S. PATENT DOCUMENTS

| | | | |
|---|---|---|---|
| 5,894,221 A * | 4/1999 | Watanabe | G01R 33/4833 324/307 |
| 6,005,390 A * | 12/1999 | Watanabe | G01R 33/4833 324/307 |
| 7,786,729 B2 * | 8/2010 | Chamberlain | G01R 33/5615 324/309 |
| 7,863,898 B2 * | 1/2011 | Park | A61B 5/055 324/307 |
| 8,072,214 B2 * | 12/2011 | Chamberlain | G01R 33/5615 324/309 |
| 8,076,939 B2 * | 12/2011 | Setsompop | G01R 33/246 324/309 |
| 8,143,889 B2 * | 3/2012 | Jeong | G01R 33/5616 324/307 |
| 8,406,849 B2 * | 3/2013 | Jeong | G01R 33/5615 600/410 |
| 9,569,863 B2 * | 2/2017 | Bhat | G06T 11/003 |
| 9,640,069 B2 * | 5/2017 | Gulani | G01R 33/3614 |
| 9,664,760 B2 * | 5/2017 | James | G01R 33/4818 |
| 9,770,186 B2 * | 9/2017 | Jeong | G01R 33/5615 |
| 10,048,339 B2 * | 8/2018 | Feiweier | G01R 33/5607 |
| 2007/0249929 A1 * | 10/2007 | Jeong | G01R 33/5615 600/410 |
| 2008/0204020 A1 * | 8/2008 | Chamberlain | G01R 33/5615 324/312 |
| 2009/0230957 A1 * | 9/2009 | Park | A61B 5/055 324/307 |
| 2010/0066361 A1 * | 3/2010 | Setsompop | G01R 33/246 324/309 |
| 2011/0068790 A1 * | 3/2011 | Chamberlain | G01R 33/5615 324/309 |
| 2013/0158384 A1 * | 6/2013 | Jeong | G01R 33/5615 600/410 |
| 2014/0037171 A1 * | 2/2014 | Bhat | G06T 11/003 382/131 |
| 2014/0292330 A1 * | 10/2014 | Gulani | G01R 33/3614 324/309 |
| 2016/0139222 A1 * | 5/2016 | Frydman | G01R 33/483 324/309 |
| 2016/0216350 A1 * | 7/2016 | Feiweier | G01R 33/5607 |

* cited by examiner

SYSTEMS AND METHODS FOR DESIGNING MULTIDIMENSIONAL SELECTIVE ADIABATIC PULSES

CROSS-REFERENCE TO RELATED APPLICATIONS

This application claims the benefit of U.S. Provisional Patent Application Ser. No. 62/325,816, filed on Apr. 21, 2016, and entitled "SYSTEMS AND METHODS FOR DESIGNING MULTIDIMENSIONAL SELECTIVE ADIABATIC PULSES."

STATEMENT REGARDING FEDERALLY SPONSORED RESEARCH

This invention was made with government support under EB015894, RR023730, and RR027290 awarded by the National Institutes of Health. The government has certain rights in the invention.

BACKGROUND

Frequency modulated ("FM") radio frequency ("RF") pulses have unique characteristics and certain advantages compared to conventional constant frequency, amplitude modulated ("AM") RF pulses. By modulating both the frequency and amplitude functions independently, the RF pulse width can be decoupled from its RF bandwidth, which is usually dictated by the pulse shape dependent time-bandwidth product, or R-value. This decoupling facilitates even distribution of RF energy with respect to time by sequentially exciting, inverting, or refocusing spin isochromats, allowing broadband excitation without the need of an increase in peak RF power.

FM pulses are widely used in in vivo magnetic resonance spectroscopy ("MRS") experiments. Often, these experiments are carried out using surface coils to maximize receive sensitivity given the limited availability of concentration for the nuclei of interest. The spatial variation in flip angle due to highly inhomogeneous $B_1$ fields produced by surface coils is overcome by carefully sweeping the frequency.

Called the "adiabatic condition," this ensures that the magnetization will follow the effective field during adiabatic rapid passage provided that the effective field is swept at a slower rate than the rotation of magnetization about this effective field. Hence, adiabatic pulses enable uniform rotations of magnetization, even with a $B_1$ field profile that spatially varies by an order of magnitude, as long as a certain $B_1$ threshold is met. This characteristic makes adiabatic pulses highly tolerant to extreme $B_1$ variations.

Spatially selective adiabatic pulses are advantageous for certain applications. For example, they can improve the selectivity of a pencil beam excitation $T_2$-prep sequence when replacing the non-selective adiabatic $\pi$ pulses. Additionally, multidimensional adiabatic pulses can be used to enable reduced field-of-view ("FOV") image acquisitions with improved time-efficiency, spatial resolution, or both. They can also be used to enhance navigator signals by selectively targeting a specific organ, thereby generating high fidelity signals that specifically originate from the moving organ. Furthermore, their high tolerance to inhomogeneous transmit $B_1^+$ makes them attractive for application at high fields, where inhomogeneity is more pronounced.

Thus, there is a desire to provide systems and methods capable of designing multidimensional, spatially-selective adiabatic pulses.

SUMMARY OF THE DISCLOSURE

The present disclosure addressed the aforementioned drawbacks by providing a method for designing a multidimensional adiabatic radio frequency (RF) pulse waveform for use in magnetic resonance imaging (MRI). The method includes providing the following to a computer system: a two-dimensional sub-pulse waveform to a computer system, a first gradient waveform defining a magnetic field gradient along a first axis, a second gradient waveform defining a magnetic field gradient along a second axis that is orthogonal to the first axis, and a parent adiabatic pulse waveform. The computer system is then used to compute a first rephasing magnetic field gradient waveform to apply along the first axis and a second rephasing magnetic field gradient waveform to apply along the second axis. The first rephasing magnetic field gradient is computed to have an area that zeroes the area under the first gradient waveform, and the second rephasing magnetic field gradient is computed to have an area that zeroes the area under the second gradient waveform. The parent adiabatic pulse waveform is discretized using the computer system to generate a plurality of pulse segments. Discretizing the parent adiabatic pulse waveform includes spacing apart each pulse segment by a duration of time. The computer system is then operated to produce a multidimensional adiabatic pulse waveform by multiplying each of the plurality of pulse segments by the provided sub-pulse waveform. The computer system also produces a gradient waveform set to be played out during the multidimensional adiabatic pulse waveform. The gradient waveform set is produced by positioning the first and second rephasing magnetic field gradient waveforms to be played out during each pulse segment.

It is another aspect of the present disclosure to provide a method for imaging a subject using an MRI system with a parallel transmit RF coil array to operate a pulse sequence that includes a multichannel parallel transmit adiabatic RF pulse. A different multichannel adiabatic RF pulse waveform is provided for each coil in the parallel transmit RF coil array. Each multichannel adiabatic RF pulse waveform comprises a plurality of sub-pulse waveforms spaced apart in time by a duration of time, driven by a discretized parent adiabatic pulse waveform, and designed based on a weighting by a transmit sensitivity profile for the respective coil in the transmit RF coil array for which the multichannel adiabatic RF pulse waveform is provided. Gradient waveforms are also provided to the MRI system. These gradient waveforms define magnetic field gradients to be generated during each sub-pulse waveform of the multichannel adiabatic RF pulse waveform. Rephasing gradient waveforms are also provided to the MRI system. These rephasing gradient waveforms define rephasing magnetic field gradients to be generated during the duration of time in between successive sub-pulse waveforms. A multichannel adiabatic RF pulse is then generated with the parallel transmit RF coil array by operating each coil using the provided different multichannel adiabatic RF pulse waveform for that coil. The MRI system is also operated to generate magnetic field gradients contemporaneously with the multichannel adiabatic RF pulse using the provided gradient waveforms and the provided rephasing gradient waveforms. Data are acquired from a subject by sampling magnetic resonance signals generated in response to the multichannel adiabatic RF pulse, and an image of the subject is reconstructed from the acquired data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 4A shows a single spin-echo configuration, and FIG. 4B shows a double spin-echo configuration. Double spin-echo configurations can compensate for the spatially quadratic phase along the frequency sweep direction, enabling isochromats within the spatially selective volume to experience identical echo times with the added advantage of balancing any residual gradient imperfections.

FIG. 5A shows a volumetric slice plot and FIGS. 5B-5D show inversion profiles along the $\Omega_y$-$\Omega_z$ plane (FIG. 5B), the $\Omega_x$-$\Omega_z$ plane (FIG. 5C), and the $\Omega_x$-$\Omega_y$ plane (FIG. 5D) obtained from Bloch simulations. Sweeping the RF amplitude ($\omega_1^{max}$) and plotting the trace of $M_z$ through the center for various offset frequencies along both the $\Omega_z$-direction (FIG. 5E) and $\Omega_x$-direction (FIG. 5F) exhibit both a linear and adiabatic regime.

FIG. 6A shows an axial view, FIG. 6B shows a sagittal view, and FIG. 6C shows a coronal view of the phantom. Compared with corresponding views (FIGS. 6D-6F) acquired using the double spin-echo sequence in FIG. 4B shows selective refocusing of a cylinder with finite height, in good agreement with simulation results shown in FIGS. 6G-6I. Experimental results exhibited slightly better selectivity than simulation results due to being obtained from a double spin-echo sequence. Inversion profiles along the radial direction (FIG. 6J) and the height direction (FIG. 6K) for various $\omega_1^{max}$ values shows adiabatic property.

FIG. 7A is an axial view and FIG. 7C is a coronal view acquired from the 3D double spin-echo sequence (FOV=256×256×256 mm, matrix size=128 x 64×64) using 3D selective adiabatic refocusing. Comparing with standard axial (FIG. 7B) and coronal (FIG. 7D) spin-echo images acquired from identical sequence parameters (TE=70 ms, TR=1 s) shows refocusing of a selective finite height cylindrical volume encapsulating the ventricles. Linear traces taken along the horizontal and vertical axes are shown for comparison. Sidebands appear along the frequency sweep direction, as seen in FIG. 7C. Flow artifacts are present due to absence of flow compensation in this example acquisition.

FIG. 8A shows an example of a spiral trajectory of a 2D sub-pulse undersampled by a factor of two, overlaid with a fully sampled trajectory. FIG. 8B is a simulation showing that undersampling introduces radial aliasing. FIG. 8C is a simulation showing that radial aliasing can be removed by applying parallel transmission using the transmit profiles, such as those shown in FIG. 8D. The boundary line in FIGS. 8B and 8C indicates the region-of-interest used to generate parallel transmit sub-pulses using the spatial domain approach.

DETAILED DESCRIPTION

Described here are systems and methods for designing and implementing multidimensional adiabatic radio frequency ("RF") pulses for use in magnetic resonance imaging ("MRI"). With these RF pulses, spatially selective inversion can be achieved adiabatically in both two-dimensional ("2D") and three-dimensional ("3D") regions-of-interest. The systems and methods described here allow for the design of multidimensional adiabatic pulses that provide 2D and 3D selective adiabatic inversion, refocusing, or both. These pulses can be further optimized, making the pulses practical for potential applications such as inner volume selection, navigation techniques, and selective inversion in the presence of inhomogeneous $B_1$ fields.

Figure 1A:
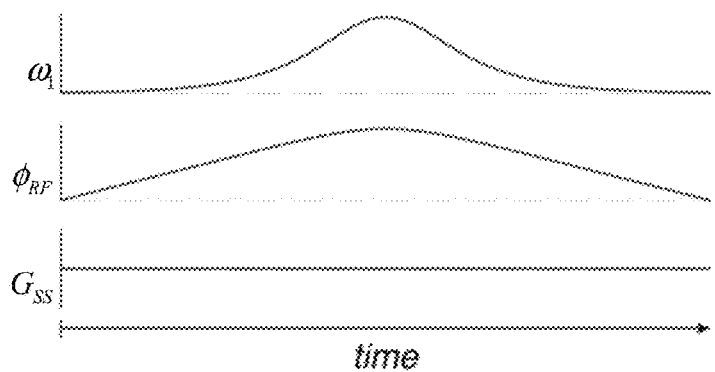
FIG. 1A shows a radio frequency ("RF") amplitude modulation function, RF phase modulation function, and constant magnetic field gradient waveform for an example continuous hyperbolic secant ("HS1") RF pulse.

The multidimensional adiabatic pulses designed according to the methods described in the present disclosure can provide selective excitation in two or three dimensions using sub-pulses that are adiabatically driven using a parent adiabatic pulse. As an example, a 3D adiabatic pulse can be designed to selectively excite in two dimensions using a sequence of 2D sub-pulses while modulating the amplitude and phases of these consecutive 2D sub-pulses according to the parent adiabatic pulse. To ensure that the adiabatic condition is equally satisfied for all Larmor frequencies in the RF frequency sweep range, the parent pulse can be chosen from the class of adiabatic pulses possessing offset-independent adiabaticity ("OIA"). By evenly distributing RF energy with respect to time, adiabatic full passage ("AFP") occurs and longitudinal magnetization is inverted from $M_z$ to $-M_z$. One example pulse that can be used to drive the adiabaticity based on the OIA principle is the hyperbolic secant pulse ("HS1"); however, it will be appreciated by those skilled in the art that other pulse waveforms can be used to achieve offset-independent adiabaticity, including an HS8 pulse (which has lower peak $B_1$ requirements as compared to the HS1 pulse), a Lorentzian OIA pulse, a Gaussian OIA pulse, a Hanning OIA pulse, and so on. The HS1 pulse function, in complex form, can be written as, $$\omega_1^{HS1}(t) = \omega_1^{max} \text{sech}(\beta\tau) e^{i\mu(\ln(\text{sech}(\beta\tau)))} \quad (1);$$

where $\omega_1^{max}$ is the maximum RF amplitude (rad/s); $\tau = 2t/(T_p-1)$ is a normalized time parameter with respect to pulse length, $T_p$, that spans the range $[-1,1]$; and $\beta$ and $\mu$ are real-valued constants. The amplitude modulation function, $\omega_1$, and RF phase modulation function, $\phi_{RF}$, of the continuous HS1 pulse, when applied in the presence of a constant gradient, $G_{SS}$, are shown in FIG. 1A.

In order to rotate magnetization adiabatically, in practice, the parent adiabatic pulse is discretized. As one example, the parent adiabatic pulse can be discretized by applying an RF pulse train composed of samples of the continuous parent adiabatic pulse waveform during a continuous magnetic field gradient. The magnetic field gradient can also be discretized by replacing the continuous magnetic field gradients with gradient blips inserted between each piecewise constant segment (i.e., between sub-pulses of the discretized parent adiabatic pulse).

Figure 1B:
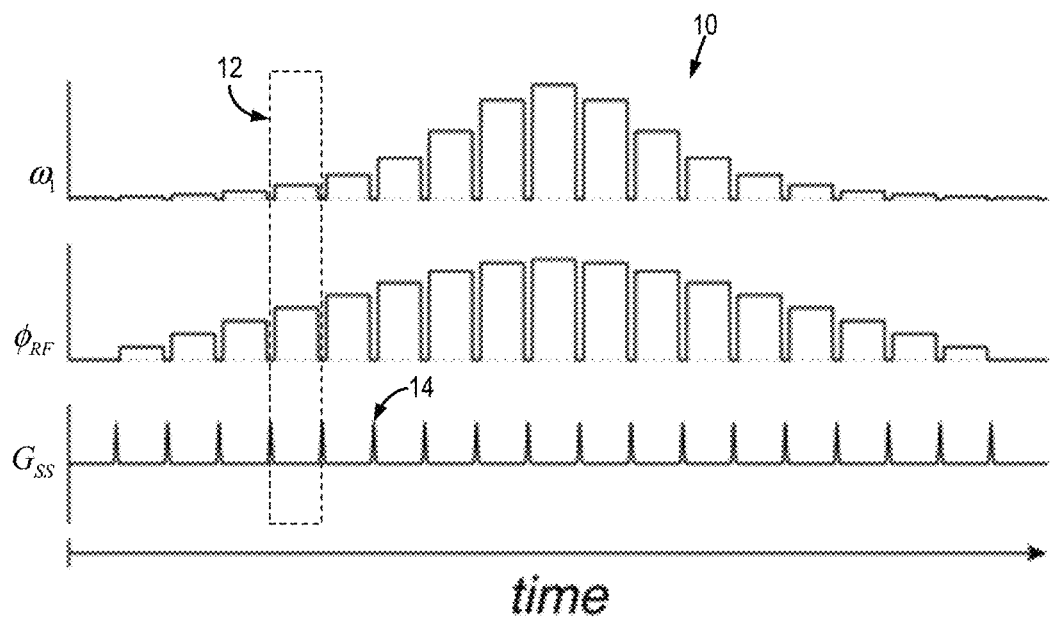
FIG. 1B shows a discretized RF amplitude modulation function, a discretized RF phase modulation function, and a series of magnetic field gradient blips for an example discretized, or "blipped," HS1 RF pulse. The discretized RF amplitude and RF phase modulation functions define RF sub-pulses for each segment in the modulation functions.

An example of a discretized HS1 pulse is shown in FIG. 1B, which can be referred to as a "blipped HS1" pulse. The discretized RF pulse 10 includes a plurality of sub-pulses 12 each composed of an amplitude modulation function and an RF phase modulation function. A gradient blip 14 is played in between each sub-pulse 12. Unlike the continuous pulse, the blipped version produces multiple aliasing sidebands (e.g., an infinite number of aliasing sidebands) due to the time domain parent pulse being multiplied by a Dirac comb function in the discretization process, which is equivalent to convolution in the reciprocal domain. For a Dirac comb with spacing, $$\Delta t = \frac{T_p}{N_{seg}}; \quad (2)$$

where $N_{seg}$ is the number of sampled segments (i.e., sub-pulse segments), the Nyquist criterion is given by, $$N_{seg} \geq N_{Nyquist} = BW \cdot T_p = R \quad (3);$$

where $N_{nyquist}$ is the minimum number of samples required to avoid aliasing, and BW is the bandwidth of the pulse. From Eqn. (3), it can be seen that the bandwidth can be increased by decreasing the duration of the parent pulse while maintaining its R-value. Accordingly, the bandwidth can be increased by decreasing the length of the 2D sub-pulse while maintaining the same number of parent pulse samples, which reduces the total pulse duration. However, reducing pulse length will lead to an increase in RF power demand. In those instances where RF power demand is a concern, the bandwidth can be increased without the power penalty by designing a new parent pulse with an increased R-value while keeping the total pulse length constant and increasing the number of parent samples accordingly.

Thus, in general, to drive the adiabaticity, each sub-pulse element is scaled in proportion to each pulse segment of the parent pulse. To advance in excitation k-space, gaps can be inserted in between pulse segments to accommodate for gradient blips, such as by discretizing both the parent pulse and the accompanying continuous magnetic field gradient. As described above, when sampling discretized, frequency-modulated ("FM") pulses, the minimum number of pulse elements needed to satisfy the Nyquist criterion is equal to the R-value of the pulse. Hence, to avoid aliasing sidebands, the total number of pulse segments, $N_{seg}$, should be greater than or equal to the R-value of the pulse.

Figure 2A:
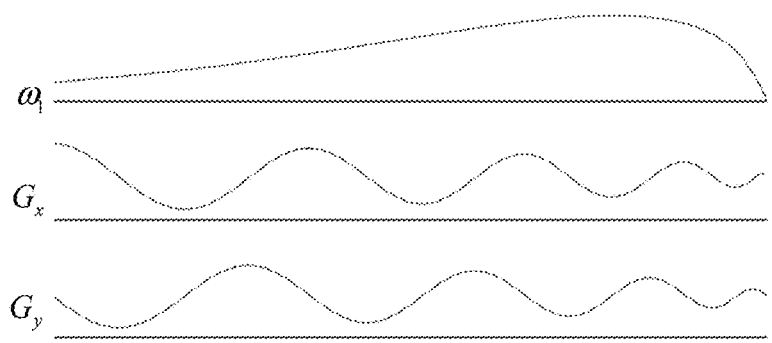
FIG. 2A shows an example of a spiral trajectory derived 2D jinc sub-pulse and corresponding magnetic field gradient waveforms.

To design a 3D adiabatic pulse, the non-selective hard pulse elements can be replaced with 2D selective pulse elements. As an example, the blipped HS1 RF pulse shown in FIG. 1B can be modified to create a 3D adiabatic pulse by combining the HS1 parent pulse with a number of sub-pulses derived from a modulation function based on a 2D k-space trajectory. In a non-limiting example, the sub-pulses can be derived from a jinc function based on a fully sampled 2D spiral k-space trajectory. FIG. 2A illustrates an example of such sub-pulses and the corresponding time-varying magnetic field gradients. Using the example sub-pulse waveforms from FIG. 2A, and the sample parent adiabatic pulse waveform from FIG. 1B, the resultant multidimensional adiabatic pulse generated using the methods described in the present disclosure can be equivalent to $N_{seg}$ spiral trajectory 2D pulses being sampled along $N_{seg}$ planes in excitation k-space, each spaced apart by, $$\gamma \int_0^{T_{blip}} G_{blip}(t) dt; \quad (4)$$

where $G_{blip}$ (t) is the gradient blip applied along the frequency sweep direction for duration, $T_{blip}$. Each spiral 2D pulse is then modulated based on the amplitude and phase of the corresponding parent pulse segment.

Figure 2B:
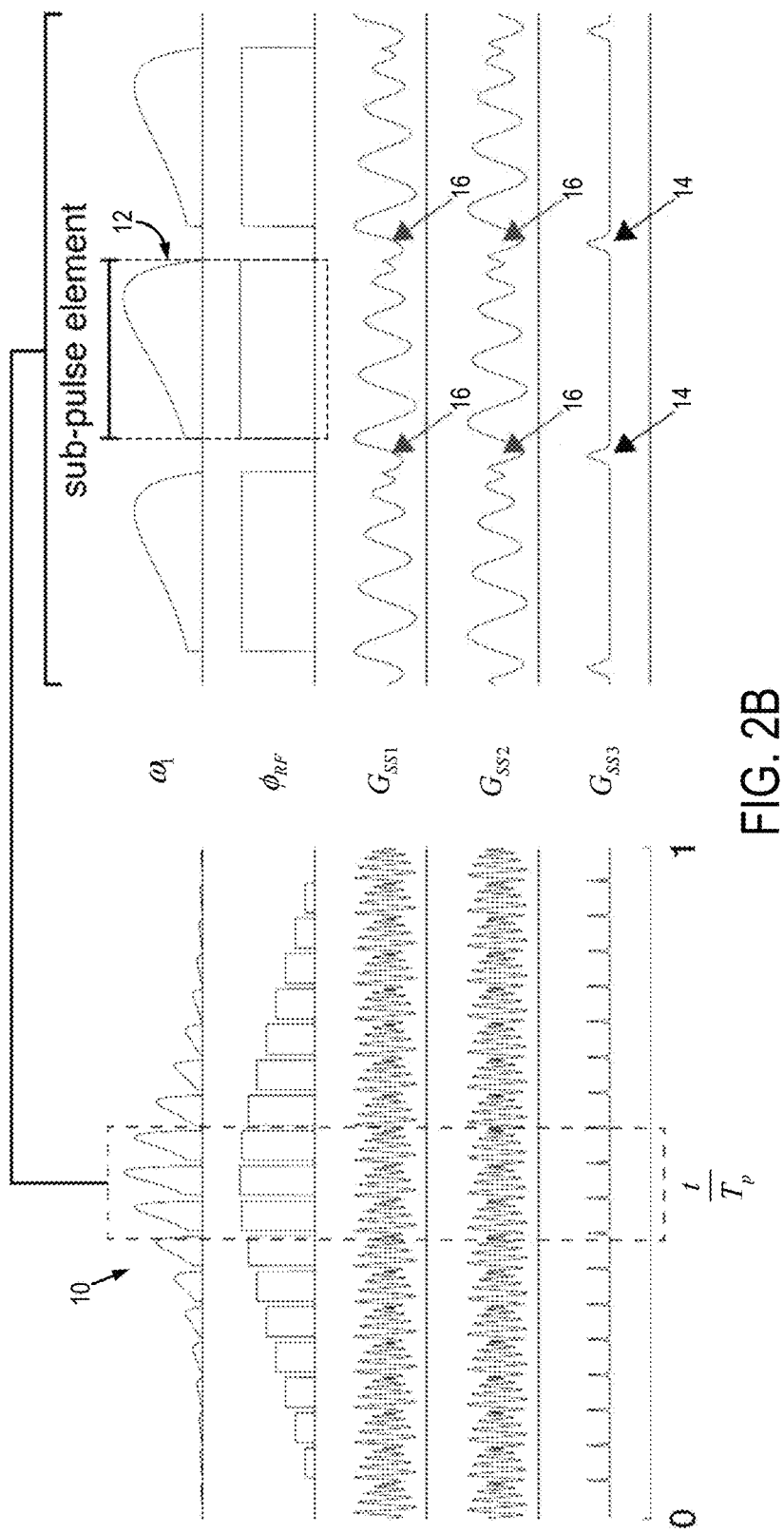
FIG. 2B shows an example of a three-dimensional adiabatic pulse formed by modulating the amplitudes of consecutive sub-pulse elements by a parent amplitude function and adding the parent and sub-pulse phases. Rephasing magnetic field gradients can be inserted between sub-pulses to nullify the gradient area accrued and to re-center k-space as indicated by the magnification of the sub-pulse elements in the dashed box. Extension to three dimensions can be done by inserting gradient blips between sub-pulses along the remaining gradient direction.

Specifically, the piece-wise constant pulse segments that result from the discretized and sufficiently oversampled parent adiabatic pulse are binned for the sub-pulse elements. Within each bin, a sufficiently sampled sub-pulse is placed and complex multiplied by the corresponding parent pulse segment. This is equivalent to modulating the amplitudes of consecutive sub-pulse elements by the parent amplitude function and adding the parent and sub-pulse phases. The resulting pulse of this example is shown in FIG. 2B. In this example, the multidimensional adiabatic pulse is a 3D adiabatic pulse. As shown in the enlarged portion, to re-center k-space for a subsequent sub-pulse element, rephasing magnetic field gradients are computed to zero the area under the gradients applied along $G_x$ and $G_y$ axes (in FIG. 2A) during each RF sub-pulse and inserted between the sub-pulses. The result is a 2D adiabatic pulse that is able to selectively invert or refocus spins within an infinitely long cylinder. Additional slab selectivity can be realized by inserting magnetic field gradient blips 14 along the $G_z$ axis direction between sub-pulse elements, as in the blipped HS1, to select a slice using the frequency-swept adiabatic parent pulse. As a result, the final 3D pulse can be used to invert or refocus magnetization within a cylinder of finite height.

From a k-space perspective, this example 3D pulse traverses a 3D k-trajectory composed of $N_{seg}$ identical 2D spiral trajectories cascaded in the third dimension with equal spacing. In choosing a trajectory for the sub-pulse, other trajectories, such as a raster trajectory, can also be used. The 2D trajectory chosen will define basic properties, such as resolution and field-of-view ("FOV"), whereas the RF weighting will determine the excitation profile. When designing the 2D sub-pulse with spiral k-space trajectories, sampling k-space by spiraling-in and spiraling-out in an alternating manner can be used to eliminate the need for the refocusing re-phasing gradients, and can thus shorten the pulse length.

The multidimensional adiabatic pulse designs described in the present disclosure are compatible with parallel transmission ("pTx") techniques. In these instances, each sub-pulse is preferably designed according to a linear low-tip-approximation. The design of pTx 3D adiabatic pulses is straightforward and can be done by replacing the single transmit 2D sub-pulses with pTx 2D sub-pulses. With pTx, shorter 2D sub-pulses can be designed without compromising 2D selectivity. Using these shorter pTx sub-pulses to generate the 3D adiabatic pulse can increase RF performance in terms of bandwidth and sideband separation. For a given number of sub-pulse segments, $N_{seg}$, using shorter pTx sub-pulses reduces the total pulse length, thereby increasing the bandwidth. For a given total pulse length, shorter pTx sub-pulses allow increased sampling of the parent pulse, thereby pushing the sidebands further away in space.

Figure 3:
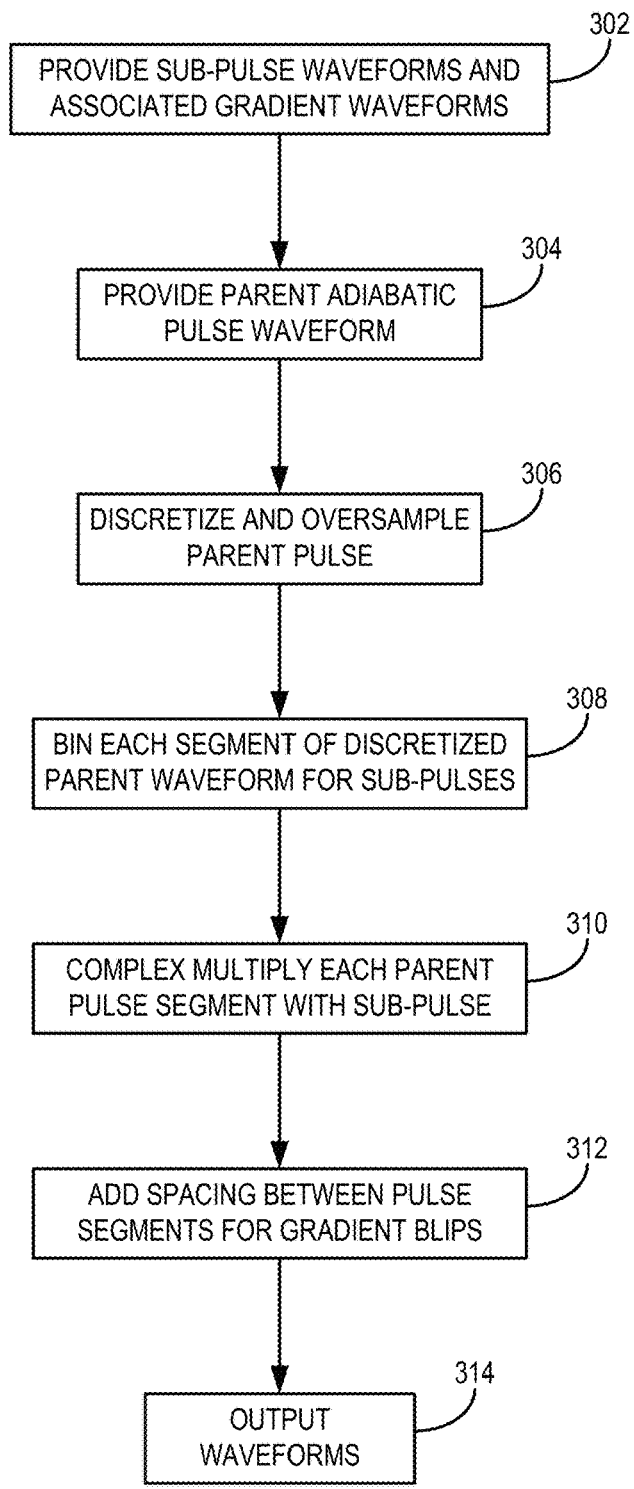
FIG. 3 is a flowchart setting forth the steps of an example method for designing multidimensional adiabatic radio frequency ("RF") pulses for use in magnetic resonance imaging ("MRI").

Referring now to FIG. 3, a flowchart is illustrated as setting forth the steps of an example method for designing multidimensional adiabatic pulses. The method includes providing a sub-pulse waveform and associated gradient waveforms to a computer system, as indicated at step 302. As one example, the sub-pulse waveform and associated gradient waveforms can be 2D sub-pulse waveforms, such as for a spiral k-trajectory 2D jinc shown in FIG. 2A.

In some embodiments, the multichannel adiabatic RF pulse is designed for use with a parallel transmit RF coil array. In these embodiments, a different multichannel adiabatic RF pulse waveform can be provided to each coil in the coil array. Thus, for these applications the sub-pulse waveforms can be 2D or 3D sub-pulse waveforms that are designed based on the transmit sensitivity profile of the coil to which the multichannel adiabatic RF pulse waveform will be provided. As one example, the sub-pulse waveforms can be designed using a spatial domain method, in which the sub-pulse waveforms are designed, in part, using a system matrix that is weighted in the spatial dimension by the transmit sensitivity profiles for each coil.

A parent adiabatic pulse waveform is also provided to the computer system, as indicated at step 304. As one example, the parent adiabatic pulse waveform can be an HS1 waveform. The parent pulse waveform is then discretized and oversampled, as indicated at step 306. An example of a discretized HS1 pulse waveform is shown in FIG. 1B. Each pulse segment in the discretized parent pulse waveform is then binned for the sub-pulse elements, as indicated at step 308. The multidimensional adiabatic pulse waveform is then produced by complex multiplying each binned parent pulse segment with a sufficiently sampled sub-pulse placed in the respective bin, as indicated at step 310. As a result of this step, the amplitudes of consecutive sub-pulse elements are effectively modulated by the parent pulse amplitude function, and the parent and sub-pulse phases are added.

To re-center k-space for the subsequent sub-pulse elements, a rephasing magnetic field gradient can be inserted between sub-pulses to nullify the area accrued under the gradients applied during the previous sub-pulse element. Thus, a spacing is provided between the sub-pulse elements in the multidimensional adiabatic pulse waveform, as indicated at step 312. In some instances, the additional gradient blip waveforms can also be selected or otherwise defined at this step.

The waveforms associated with the multidimensional adiabatic pulse are then output, as indicated at step 314. As one example, the waveforms can be output by providing them to an MRI system, and as another example the waveforms can be output by storing them in a memory or other data storage for later use. The output waveforms generally include the modulated sub-pulse elements generated in step 310 as spaced apart by the spacing selected in step 312. In some examples, the output waveforms may also include the gradient waveforms associated with the sub-pulse waveforms, as provided in step 302. The output waveforms may also include rephasing gradient waveforms, gradient blip waveforms, or both, to be played out during each sub-pulse of the desired adiabatic pulse.

One efficient method for achieving the desired inversion profile with a multichannel transmitter is to use a multi-channel adiabatic inversion pulse in a spin-echo sequence as a spatially selective $\pi$-pulse following a $\pi/2$ excitation, which eliminates the need of obtaining two acquisitions and, thus, reduces scan time. The $\pi/2$ excitation may be a non-selective excitation, or may be a selective excitation (e.g., spatially selective).

Figure 4A:
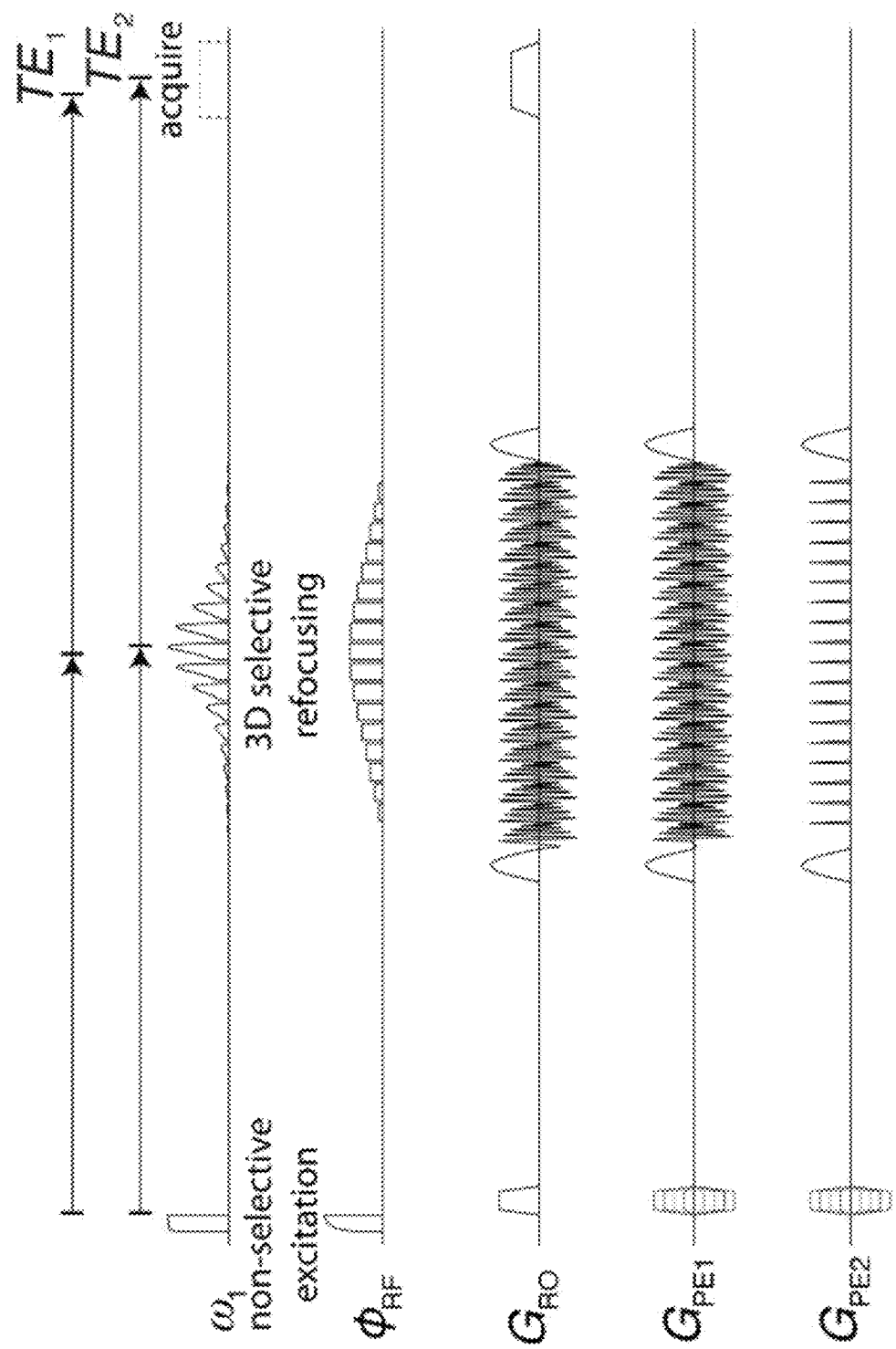
FIGS. 4A-4B show examples of single spin-echo and double spin-echo pulse sequences implementing 3D adiabatic pulses that can be used as a spatially selective refocusing π-pulse following a π/2 excitation.

When using an odd number of $\pi$-pulse(s), such as in the pulse sequence illustrated in FIG. 4A, isochromats along the blipped frequency sweep direction will experience different echo times ("TE"), where isochromats that were excited first refocus last and vice versa. An even number of $\pi$-pulses can compensate for the spatially quadratic phase along the frequency sweep direction to remove this difference in echo times, enabling all isochromats within the spatially selective volume to experience an identical TE with the added advantage of balancing any gradient imperfections. An example of a pulse sequence that implements this configuration is shown in FIG. 3B.

Half sine crusher gradients can be placed before and after the 3D refocusing pulses to ensure that the acquired echo signals originated as a spin-echo coherence, as shown in FIGS. 3A and 3B. For the double echo configuration, the crusher amplitudes of the first and second refocusing pulses can be applied with different strengths to mitigate the generation of undesired, stimulated echoes, as shown in FIG. 3B.

Example 1: Numerical Simulations

An in-house Bloch simulator programmed in C-language and MATLAB (MathWorks, Inc.; Natick, Mass., USA) was used to validate the method described above. 3D simulations were carried out for a 22.912 ms pulse made of 3.5 turn spiral trajectory 256 element jinc weighted 2D sub-pulses driven adiabatically by a 19 element HS1 parent pulse of time-bandwidth product 9.5, such as those shown in FIGS. 2A-2C. The resulting $M_z$ profiles were obtained from a 48×48×48 single isochromat matrix. Peak RF power was linearly swept to confirm spatially selective inversion and adiabaticity.

To confirm validity of utilizing the 3D adiabatic pulse in a spin-echo scheme, four separate simulations were generated assuming an initial magnetization along the transverse plane, and summed according to EXORCYCLE phase cycling. It was demonstrated that the resulting transverse magnetization after selective refocusing was identical to the inversion profile produced assuming initial magnetization along $M_z$.

Example 1 Results

The volumetric slice image and inversion profiles along the axial ($\Omega_x$-$\Omega_y$), coronal ($\Omega_x$-$\Omega_z$), and saggital ($\Omega_y$-$\Omega_z$) planes are shown in FIGS. 5A-5D. In the axial view, a circular shape was selectively inverted, whereas a rectangular shape was inverted along both the coronal and saggital directions. Thus, the 3D pulse selectively inverted a cylinder of finite height. The bandwidth along the $\Omega_x$ and $\Omega_y$ directions was dictated by the bandwidth of the 2D jinc pulse and was the same along both of these directions because of radial symmetry, whereas the bandwidth along the $\Omega_z$ direction was given by the frequency sweep of the parent HS1 pulse.

Sweeping the RF amplitude and plotting the trace of $M_z$ through the center for various offset frequencies along both the radial $\Omega_x$-direction and height $\Omega_z$-direction, the following properties were observed. In the $\Omega_z$-direction (FIG. 5E), a linear regime ($\omega_1^{max}/2\pi$=0~250 Hz) and adiabatic regime ($\omega_1^{max}/2\pi$=325~ Hz) was observed, resembling the profile of the one-dimensional parent HS1. In the $\Omega_x$-direction (FIG. 5F), a similar linear and adiabatic regime was observed. However, the profile along the radial direction increased and flattened out as $\omega_1^{max}$ was increased.

Example 2: Magnetic Resonance Imaging Experiments

Figure 4B:
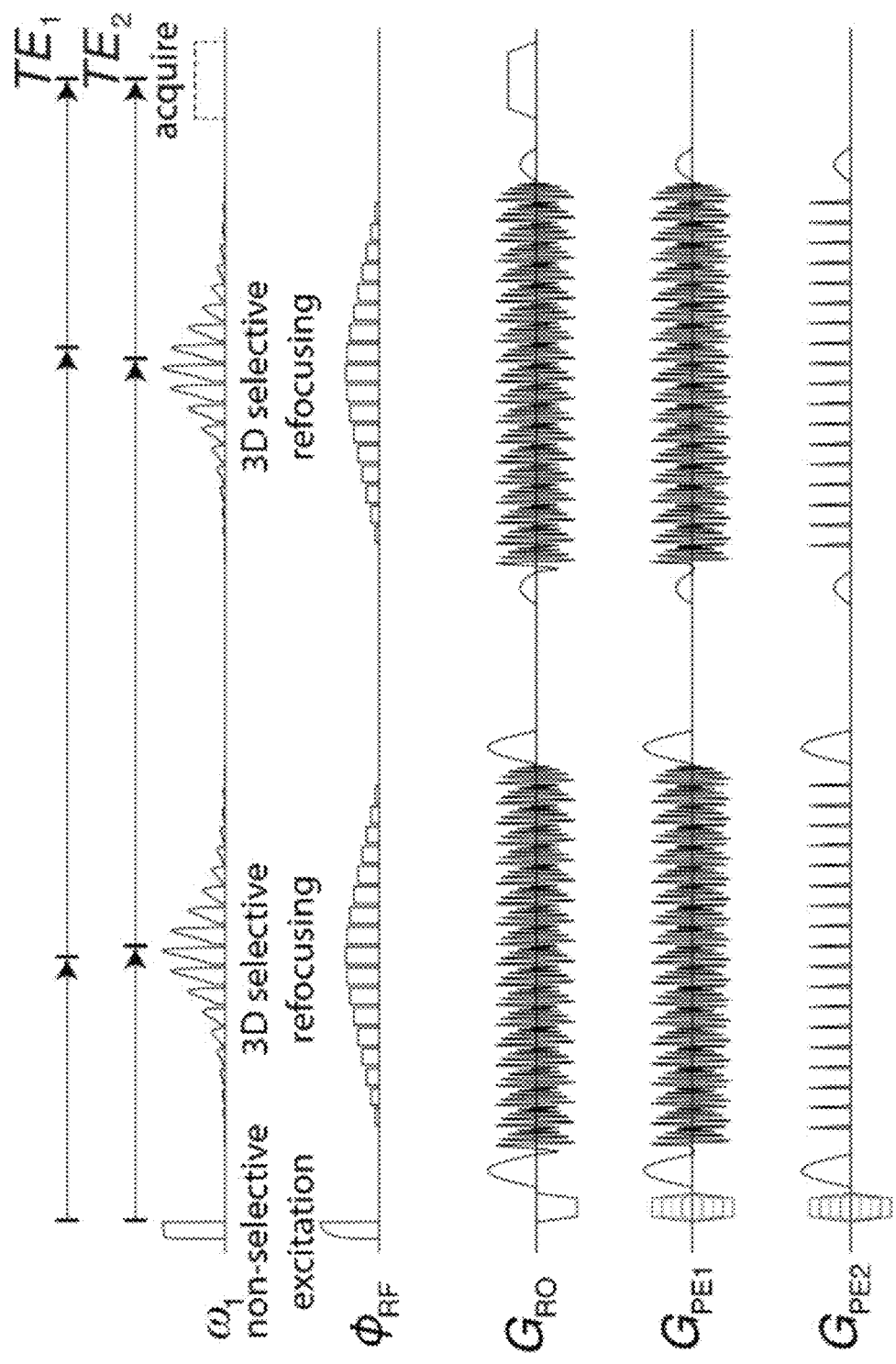
Figures 5A, 5B, 5C, 5D, 5E, 5F:
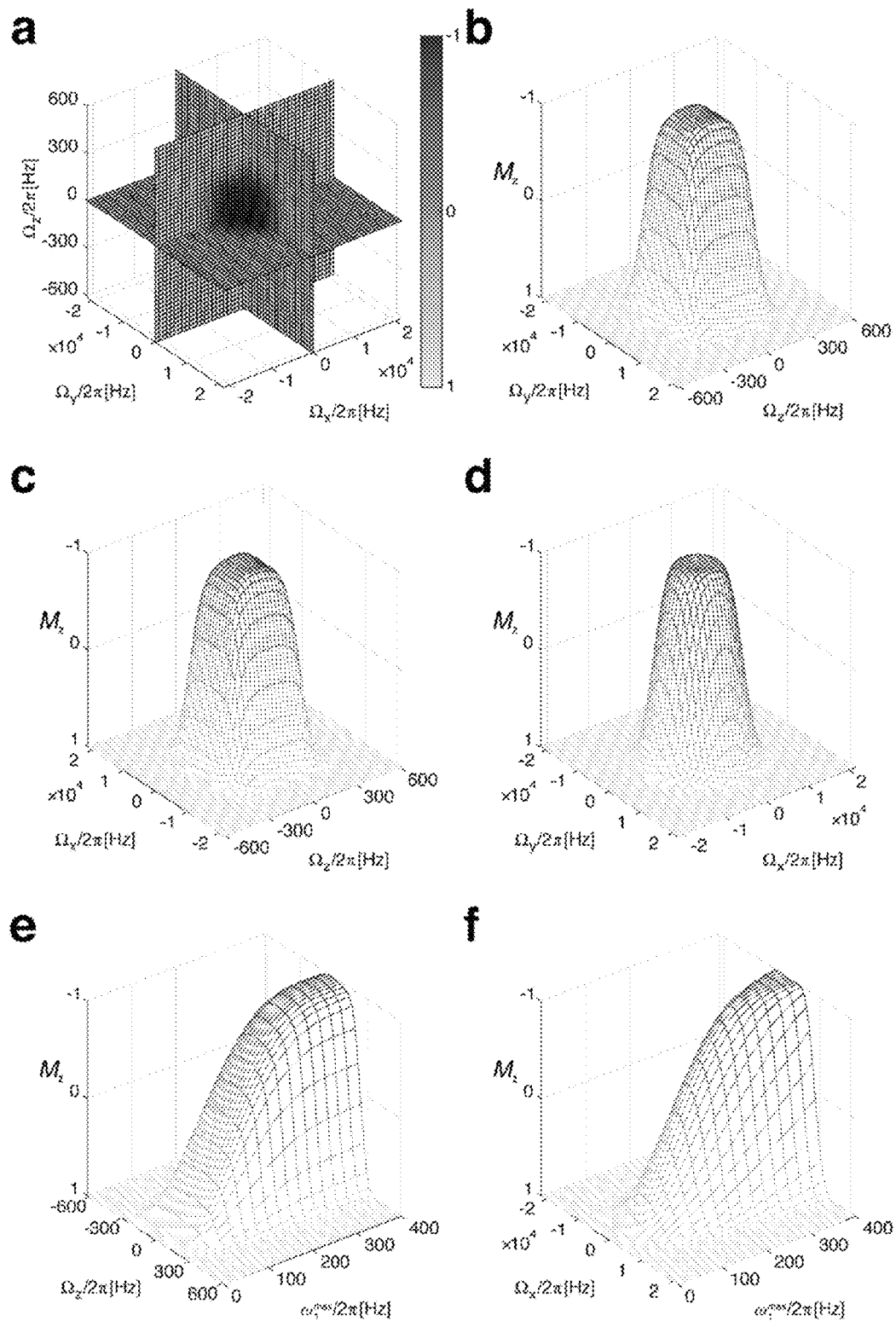
FIGS. 5A-5F show examples of a volumetric slice and inversion profiles along various directions in the volumetric slice.

An example 3D inversion profile was also experimentally verified on an MRI system. The same pulse verified through simulations was used as a π-pulse in a double spin echo sequence (e.g., the pulse sequence shown in FIG. 4B) on a cylindrical water phantom doped with 1.5 percent agar and 0.1 mM Gd ($T_1$ about 1 second and $T_2$ about 160 ms). The gradients, which were well within the gradient slew-rate constraint, were measured and fine-tuned for all three directions. The spiral gradients showed minimum distortion, but the blip gradient exhibited a prolonged undershoot that leaked into the subsequent sub-pulse. To account for this, a gradient corrected parent HS1 pulse was regenerated, which was then used to construct a gradient corrected 3D pulse.

In vivo images of the human brain from healthy volunteers were obtained. Double spin-echo images using 3D adiabatic inversion and standard spin-echo images with identical sequence parameters were obtained for comparison. A 16-element transverse electromagnetic ("TEM") head coil was used in the above experiments.

Figures 8A, 8B, 8C, 8D:
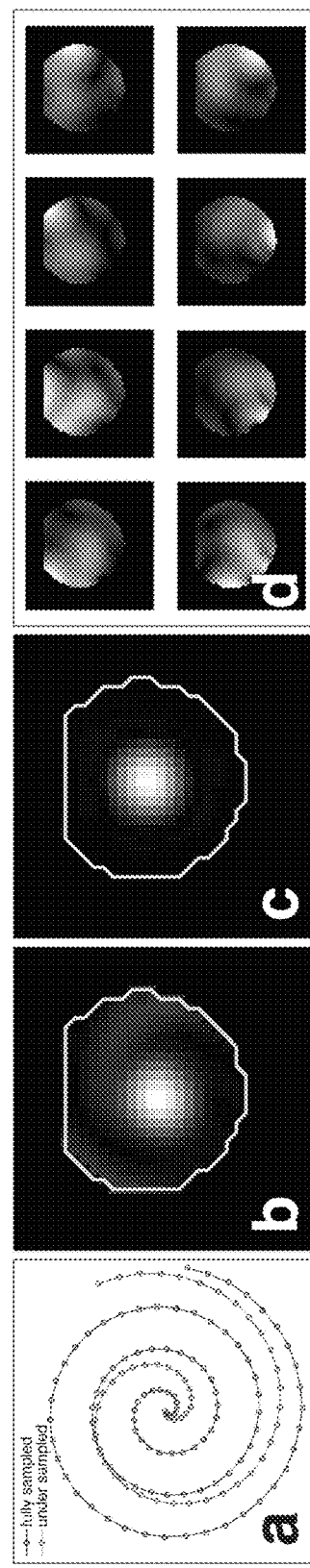
FIGS. 8A-8D illustrate an example of implementing parallel transmission with multidimensional adiabatic pulses described in the present disclosure.

To demonstrate multidimensional adiabatic pulses with pTx, different single transmit (1Tx) mode and pTx 3D adiabatic pulses were designed and experimentally verified for comparison. These included: (i) a baseline pulse with $N_{seg}$=19 and T=24 ms; (ii) a pulse designed using the same number of sub-pulse segments as the baseline pulse (i.e., $N_{seg}$=19), but with jinc-derived sub-pulses created from the undersampled spiral trajectory used in pTx ($T_p$=14 ms); and (iii) a pulse designed with twice the number of sub-pulse segments of the baseline pulse (i.e., $N_{seg}$=38) while maintaining pulse length ($T_p$=24) by using the same undersampled jinc-derived sub-pulses as above. In this example, a spiral k-space trajectory was undersampled by halving the number of turns used in the fully sampled trajectory (FIG. 8A), thus undersampling by half along the radial direction. The target pattern was manually drawn and positioned at the center of the transverse slice as shown in FIG. 8B and FIG. 8C. The pulse design problem was formulated in the image domain as a least squares minimization and was solved using conjugate gradient iterations based on the eight sensitivity profiles shown in FIG. 8D.

Example 2 Results

Figures 6A, 6B, 6C, 6D, 6E, 6F, 6G, 6H, 6I, 6J, 6K:
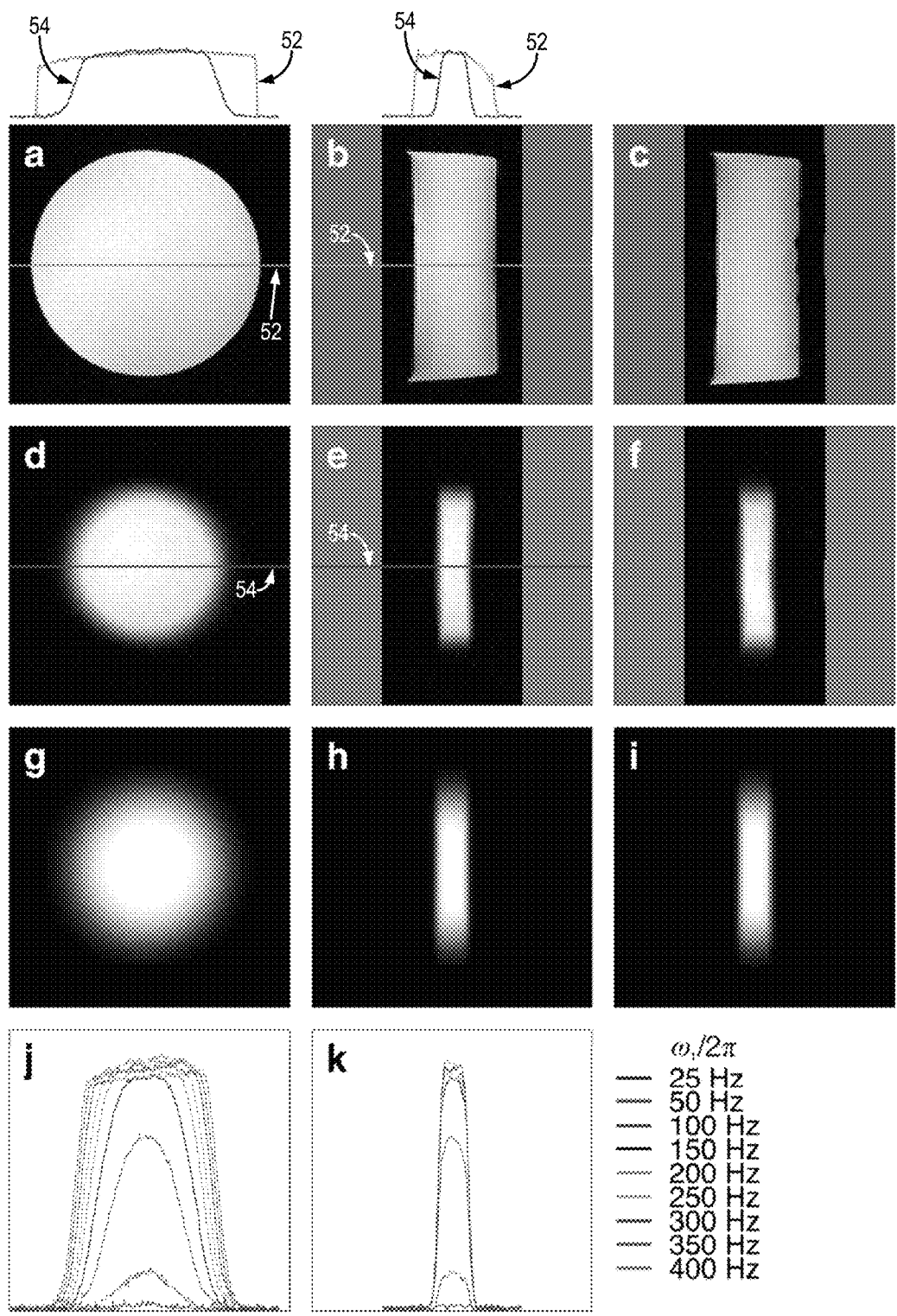
FIGS. 6A-6K show example images of a phantom.

The phantom experiment results are shown in FIGS. 6A-6K. The axial, sagittal, and coronal views of the phantom obtained from a double spin-echo sequence using an adiabatic half passage ("AHP") for excitation and adiabatic full passage ("AFP") for refocusing are shown in FIGS. 6A-6C, respectively. The corresponding views obtained from double 3D selective adiabatic refocusing (FIGS. 6D-6F) show a cylindrical region of finite height in which refocusing was achieved, agreeing well with the simulation results (FIGS. 6G-6I). Overlaying the trace plots of the phantom images 52 acquired without the 3D selective pulse and the images 54 acquired with the 3D selective pulse demonstrates the ability to achieve spatially selective refocusing.

The experimental 3D profiles were sharper as compared to the simulation results due to the image being obtained from a double spin-echo, whereas the simulation shown was the profile following pulse application. The inversion profiles along the radial and height directions were also obtained for various RF amplitudes. In agreement with simulation results, the radial profile increased and flattened out as $\omega_1^{max}$ was increased and the profile along the height direction resembled that of a 1D HS1.

Figures 7A, 7B, 7C, 7D:
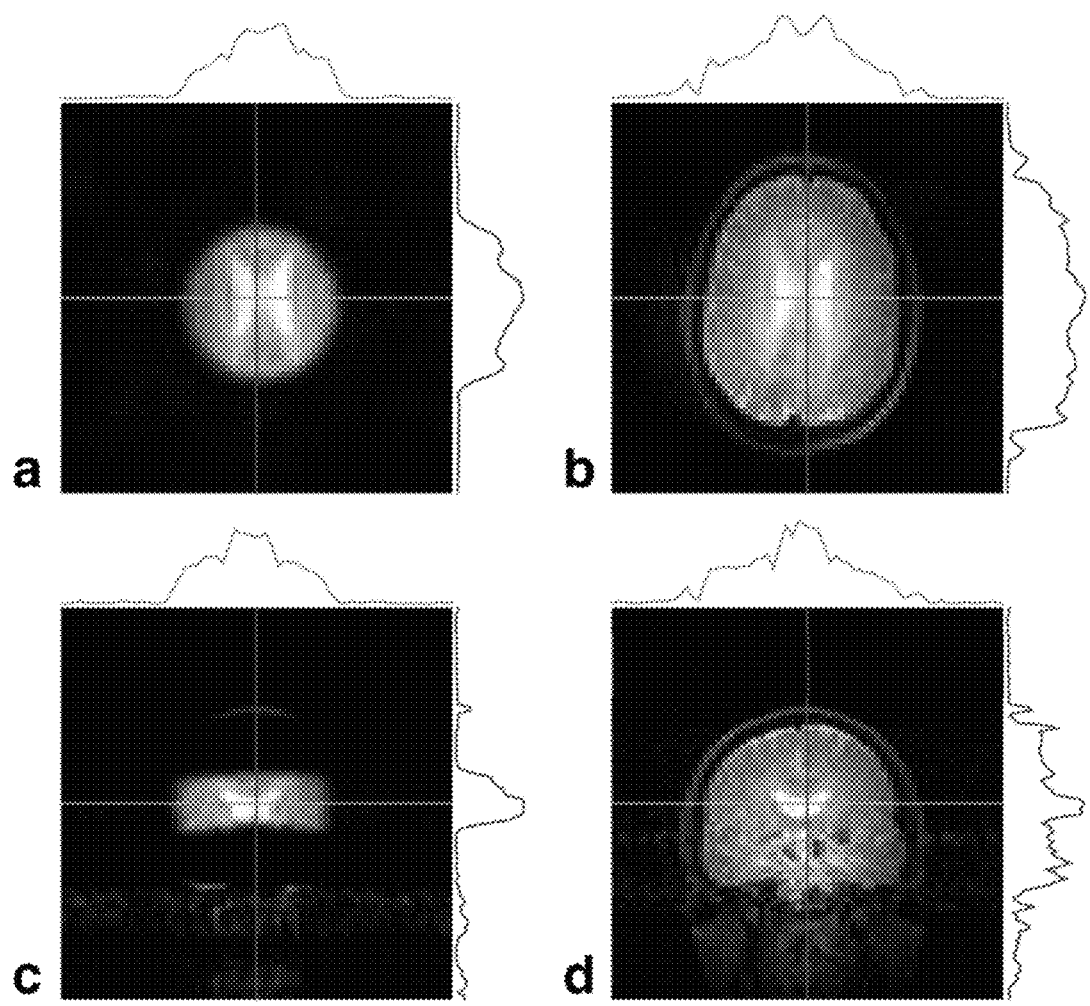
FIGS. 7A-7D show example images acquired from a subject using a 3D double spin-echo pulse sequence using 3D selective adiabatic refocusing (e.g., the sequence shown in FIG. 4B) compared with images acquired with a conventional spin echo pulse sequence.

In vivo images of the human brain are shown in FIGS. 7A-7D. FIGS. 7A and 7C are, respectively, the axial and coronal views acquired from 3D double spin-echo (FOV=256×256×256 mm, matrix size=128×64×64) using a 3D selective adiabatic pulse (e.g., using the pulse sequence shown in FIG. 4B). Comparing these images with the standard spin-echo images shown in FIGS. 7B and 7D, which were acquired using identical sequence parameters (TE=70 ms, TR=1 s), showed spin refocusing in a selected finite height cylindrical volume encapsulating the ventricles. Linear traces taken along the horizontal and vertical axes show no refocused signal beyond the radius of refocusing in the axial view, while sidebands of refocused signal are observed along the frequency sweep direction in the coronal view. In both coronal views (FIGS. 7C and 7D), flow artifacts were present due to the absence of flow compensation in acquisition.

Figures 9A, 9B, 9C, 9D, 9E, 9F, 9G, 9H, 9I, 9J:
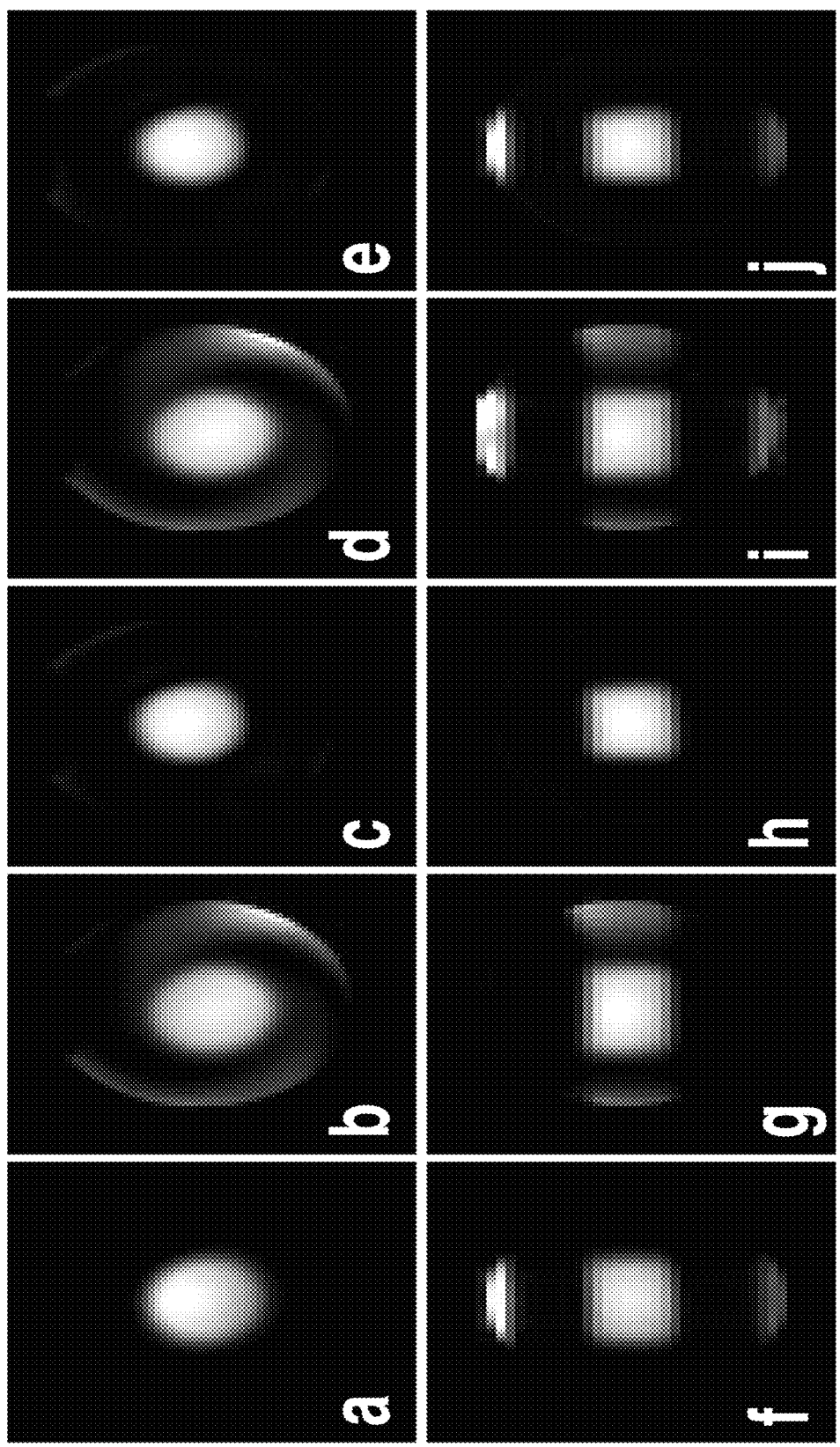
FIGS. 9A-9J show example inversion profiles obtained using parallel transmission from FIGS. 8A-8D. Axial views of the inversion profile produced using baseline single excitation (pulse width $T_p$=24 ms) (FIG. 9A), pulse generated using 2× increased parent HS1 sampling and radially undersampled sub-pulse ($T_p$=24 ms) (FIG. 9B), pulse generated using 2× increased parent HS1 sampling and pTx sub-pulses ($T_p$=24 ms) (FIG. 9C), pulse generated with original parent HS1 sampling and radially undersampled sub-pulse ($T_p$=14 ms) (FIG. 9D), and pulse generated with original parent HS1 sampling and pTx sub-pulses ($T_p$=14 ms) (FIG. 9E). Corresponding coronal views (FIGS. 9F-9J) of the inversion profile produced by each pulse. Parallel transmission is able to improve the relevant performance of the 3D pulse by either removing the aliasing sidebands (FIGS. 9C and 9H) or shortening the overall pulse width (FIGS. 9E and 9J).

FIGS. 9A-9J show pTx experimental results, demonstrating the advantages of using pTx over its single transmit counterpart. While retaining its circular in-plane inversion fidelity (FIG. 9A versus FIG. 9C), the pTx 3D pulse designed with the same pulse length but twice the segments was able to eliminate the undesired sidebands observed in the single transmit baseline pulse within the imaging FOV (FIG. 9F versus FIG. 9H). Likewise, the pTx 3D pulse designed with the same number of segments (and thus reduced pulse length), also preserved its circular in-plane inversion fidelity (FIG. 9A versus FIG. 9E), In contrast, both 1Tx 3D pulse counterparts produced an in-plane inversion pattern contaminated by undesired radial aliasing (FIG. 9A versus FIG. 9B and FIG. 9D). Furthermore, this experimentally observed in-plane aliasing agreed well with the corresponding Bloch simulation results (FIG. 8B)

Discussion

In the preceding example studies, a 3D selective adiabatic full passage pulse was simulated and experimentally verified. To minimize pulse width, the 2D spiral sub-pulses were minimized in length within the gradient hardware specifications, resulting in a pulse width of 1 ms, while an R-value of 9.5 for the parent pulse was used to limit the number of sub-pulse elements to 19 based on an oversampling rate of 2. The final pulse length was 23 ms with a corresponding bandwidth of 488 Hz along the frequency sweep direction. In these human in vivo studies, refocused signal was produced in the baseband, as well as in multiple sidebands.

One barrier for shortening the overall pulse width is the gradient hardware performance, which determines both the sub-pulse and gradient blip length. For the gradient system used in these example demonstrations, the slew rate was 100 T/m/s. Using gradient hardware standard on clinical systems (e.g., with a slew rate of 200 T/m/s), the overall pulse length can be decreased by $1/\sqrt{2}$, resulting in a 16 ms pulse, at the expense of a $\sqrt{2}$ times higher peak RF amplitude requirement.

Further optimization can be realized by taking advantage of parallel transmission techniques. When the 2D sub-pulses are designed using a low-tip angle approximation, the sub-pulse can be under-sampled to exploit coil sensitivity while being adiabatically driven through the parent pulse, thus shortening the overall pulse length.

As was shown in the experimental studies described above, while retaining a circular in-plane inversion fidelity, the pTx 3D pulse designed with the same pulse length but twice the segments was able to eliminate the undesired sidebands observed in the single transmit baseline pulse within the imaging FOV. Likewise, the pTx 3D pulse designed with the same number of segments (and thus reduced pulse length), also preserved its circular in-plane inversion fidelity.

Because of their insensitivity to $B_1^+$ inhomogeneity, pTx 3D adiabatic pulses designed according to the methods described in the present disclosure are expected to be beneficial for ultra-high-field applications. At ultra-high-field strengths, local SAR becomes a limiting RF safety factor that needs to be addressed. For these applications, rather than design the constituent pTx 2D sub-pulses by controlling only the integrated RF power (which is proportional to the global SAR), the constituent pTx 2D sub-pulses can be designed by incorporating explicit constraints on both global and local SAR to ensure compliance with safety guidelines.

A method for designing multidimensional selective adiabatic pulses has thus been introduced and evaluated through both simulations and experiments. It was shown that by using standard clinical systems and utilizing parallel transmission, the multidimensional adiabatic pulse length can be shortened for more clinically practical use in applications such as inner volume selection, navigation techniques, and inversion and refocusing in the presence of inhomogeneous $B_1$ fields.

Figure 10:
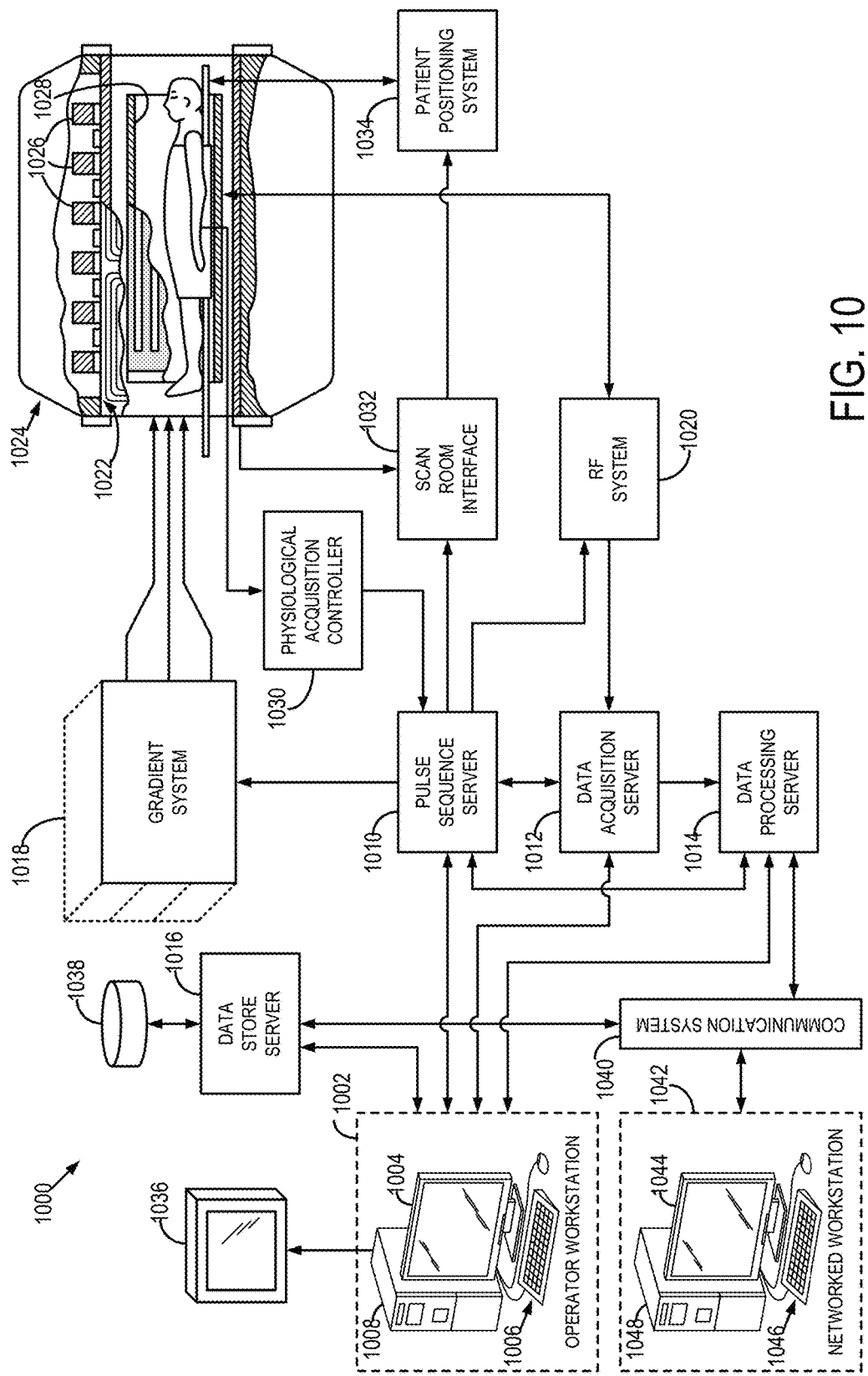
FIG. 10 is a block diagram of an example of a magnetic resonance imaging ("MRI") system that can implement the methods described in the present disclosure.

Referring particularly now to FIG. 10, an example of a magnetic resonance imaging ("MRI") system 1000 that can implement the methods described here is illustrated. The MRI system 1000 includes an operator workstation 1002 that may include a display 1004, one or more input devices 1006 (e.g., a keyboard, a mouse), and a processor 1008. The processor 1008 may include a commercially available programmable machine running a commercially available operating system. The operator workstation 1002 provides an operator interface that facilitates entering scan parameters into the MRI system 1000. The operator workstation 1002 may be coupled to different servers, including, for example, a pulse sequence server 1010, a data acquisition server 1012, a data processing server 1014, and a data store server 1016. The operator workstation 1002 and the servers 1010, 1012, 1014, and 1016 may be connected via a communication system 1040, which may include wired or wireless network connections.

The pulse sequence server 1010 functions in response to instructions provided by the operator workstation 1002 to operate a gradient system 1018 and a radiofrequency ("RF") system 1020. Gradient waveforms for performing a prescribed scan are produced and applied to the gradient system 1018, which then excites gradient coils in an assembly 1022 to produce the magnetic field gradients $G_x$, $G_y$, and $G_z$ that are used for spatially encoding magnetic resonance signals. The gradient coil assembly 1022 forms part of a magnet assembly 1024 that includes a polarizing magnet 1026 and a whole-body RF coil 1028.

RF waveforms are applied by the RF system 1020 to the RF coil 1028, or a separate local coil to perform the prescribed magnetic resonance pulse sequence. Responsive magnetic resonance signals detected by the RF coil 1028, or a separate local coil, are received by the RF system 1020. The responsive magnetic resonance signals may be amplified, demodulated, filtered, and digitized under direction of commands produced by the pulse sequence server 1010. The RF system 1020 includes an RF transmitter for producing a wide variety of RF pulses used in MRI pulse sequences. The RF transmitter is responsive to the prescribed scan and direction from the pulse sequence server 1010 to produce RF pulses of the desired frequency, phase, and pulse amplitude waveform. The generated RF pulses may be applied to the whole-body RF coil 1028 or to one or more local coils or coil arrays.

The RF system 1020 also includes one or more RF receiver channels. An RF receiver channel includes an RF preamplifier that amplifies the magnetic resonance signal received by the coil 1028 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \quad (5);$$

and the phase of the received magnetic resonance signal may also be determined according to the following relationship:

$$\varphi = \tan^{-1}\left(\frac{Q}{I}\right). \quad (6)$$

The pulse sequence server 1010 may receive patient data from a physiological acquisition controller 1030. By way of example, the physiological acquisition controller 1030 may receive signals from a number of different sensors connected to the patient, including electrocardiograph ("ECG") signals from electrodes, or respiratory signals from a respiratory bellows or other respiratory monitoring devices. These signals may be used by the pulse sequence server 1010 to synchronize, or "gate," the performance of the scan with the subject's heart beat or respiration.

The pulse sequence server 1010 may also connect to a scan room interface circuit 1032 that receives signals from various sensors associated with the condition of the patient and the magnet system. Through the scan room interface circuit 1032, a patient positioning system 1034 can receive commands to move the patient to desired positions during the scan.

The digitized magnetic resonance signal samples produced by the RF system 1020 are received by the data acquisition server 1012. The data acquisition server 1012 operates in response to instructions downloaded from the operator workstation 1002 to receive the real-time magnetic resonance data and provide buffer storage, so that data is not lost by data overrun. In some scans, the data acquisition server 1012 passes the acquired magnetic resonance data to the data processor server 1014. In scans that require information derived from acquired magnetic resonance data to control the further performance of the scan, the data acquisition server 1012 may be programmed to produce such information and convey it to the pulse sequence server 1010. For example, during pre-scans, magnetic resonance data may be acquired and used to calibrate the pulse sequence performed by the pulse sequence server 1010. As another example, navigator signals may be acquired and used to adjust the operating parameters of the RF system 1020 or the gradient system 1018, or to control the view order in which k-space is sampled. In still another example, the data acquisition server 1012 may also process magnetic resonance signals used to detect the arrival of a contrast agent in a magnetic resonance angiography ("MRA") scan. For example, the data acquisition server 1012 may acquire magnetic resonance data and processes it in real-time to produce information that is used to control the scan.

The data processing server 1014 receives magnetic resonance data from the data acquisition server 1012 and processes the magnetic resonance data in accordance with instructions provided by the operator workstation 1002. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 1014 are conveyed back to the operator workstation 1002 for storage. Real-time images may be stored in a data base memory cache, from which they may be output to operator display 1002 or a display 1036. Batch mode images or selected real time images may be stored in a host database on disc storage 1038. When such images have been reconstructed and transferred to storage, the data processing server 1014 may notify the data store server 1016 on the operator workstation 1002. The operator workstation 1002 may be used by an operator to archive the images, produce films, or send the images via a network to other facilities.

The MRI system 1000 may also include one or more networked workstations 1042. For example, a networked workstation 1042 may include a display 1044, one or more input devices 1046 (e.g., a keyboard, a mouse), and a processor 1048. The networked workstation 1042 may be located within the same facility as the operator workstation 1002, or in a different facility, such as a different healthcare institution or clinic.

The networked workstation 1042 may gain remote access to the data processing server 1014 or data store server 1016 via the communication system 1040. Accordingly, multiple networked workstations 1042 may have access to the data processing server 1014 and the data store server 1016. In this manner, magnetic resonance data, reconstructed images, or other data may be exchanged between the data processing server 1014 or the data store server 1016 and the networked workstations 1042, such that the data or images may be remotely processed by a networked workstation 1042.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for designing a multidimensional adiabatic radio frequency (RF) pulse waveform for use in magnetic resonance imaging (MRI), the steps of the method comprising:
   (a) providing to a computer system:
       a two-dimensional sub-pulse waveform to a computer system;
       a first gradient waveform defining a magnetic field gradient along a first axis;
       a second gradient waveform defining a magnetic field gradient along a second axis that is orthogonal to the first axis;
       a parent adiabatic pulse waveform;
   (b) computing with the computer system:
       a first rephasing magnetic field gradient waveform to apply along the first axis, wherein the first rephasing magnetic field gradient has an area computed to zero an area under the first gradient waveform;
       a second rephasing magnetic field gradient waveform to apply along the second axis, wherein the second rephasing magnetic field gradient has an area computed to zero an area under the second gradient waveform;
   (c) discretizing the parent adiabatic pulse waveform using the computer system to generate a plurality of pulse segments, wherein discretizing the parent adiabatic pulse waveform includes spacing apart each pulse segment by a duration of time;
   (d) producing with the computer system:
       a multidimensional adiabatic pulse waveform by multiplying each of the plurality of pulse segments by the provided sub-pulse waveform; and
       a gradient waveform set to be played out during the three-dimensional adiabatic pulse waveform by positioning the first and second magnetic field gradient waveforms to be played out during each pulse segment, and positioning the first and second rephasing magnetic field gradients to be played out during each duration of time between successive pulse segments.

2. The method as recited in claim 1, wherein step (d) includes performing a complex multiplication, such that each sub-pulse waveform is amplitude modulated by an amplitude of the corresponding pulse segment and such that a phase of the sub-pulse waveform is added with a phase of the corresponding pulse segment.

3. The method as recited in claim 1, wherein step (c) includes oversampling the parent adiabatic pulse waveform while discretizing the parent adiabatic pulse waveform.

4. The method as recited in claim 1, wherein the parent adiabatic pulse waveform provided in step (a) is an adiabatic full passage waveform.

5. The method as recited in claim 1, wherein step (b) further includes computing with the computer system, a magnetic field gradient blip waveform to apply along a third axis that is orthogonal to the first axis and the second axis, and wherein the gradient waveform set produced in step (d) includes positioning the magnetic field gradient blip to be played out during each duration of time between successive pulse segments.

6. The method as recited in claim 1, further comprising providing the multidimensional adiabatic pulse waveform and the gradient waveform set to a magnetic resonance imaging (MRI) system and operating the MRI system to generate a multidimensional adiabatic pulse using the multidimensional adiabatic pulse waveform and the gradient waveform set.

7. The method as recited in claim 6, further comprising acquiring k-space data with the MRI system after generating the multidimensional adiabatic pulse, and reconstructing an image from the acquired k-space data.

8. A method for imaging a subject using a magnetic resonance imaging (MRI) system with a parallel transmit radio frequency (RF) coil array to operate a pulse sequence that includes a multichannel adiabatic radio frequency (RF) pulse, the steps of the method comprising:

(a) providing to the MRI system, a different multichannel adiabatic RF pulse waveform for each coil in the parallel transmit RF coil array, wherein each multichannel adiabatic RF pulse waveform comprises a plurality of sub-pulse waveforms designed based on a weighting by a transmit sensitivity profile for the respective coil in the transmit RF coil array, and are spaced apart in time by a duration of time and driven by a discretized parent adiabatic pulse waveform for which the multichannel adiabatic RF pulse waveform is provided;

(b) providing gradient waveforms to the MRI system, wherein the gradient waveforms define magnetic field gradients to be generated during each sub-pulse waveform of the multichannel adiabatic RF pulse waveform;

(c) providing rephasing gradient waveforms to the MRI system, wherein the rephasing gradient waveforms define magnetic field gradients to be generated during the duration of time in between successive sub-pulse waveforms;

(d) generating a multichannel adiabatic RF pulse with the parallel transmit RF coil array by operating each coil using the provided different multichannel adiabatic RF pulse waveform for that coil, (e) generating magnetic field gradients with the MRI system contemporaneously with the multichannel adiabatic RF pulse using the provided gradient waveforms and the provided rephasing gradient waveforms;

(f) acquiring data from a subject by sampling magnetic resonance signals generated in response to the multichannel adiabatic RF pulse; and (g) reconstructing an image of the subject from the acquired data.

9. The method as recited in claim 8, wherein magnetic field rephasing gradients are played out during each duration of time along only a first gradient axis and a second gradient axis that is orthogonal to the first gradient axis, such that the multichannel adiabatic pulse waveform defines a two-dimensional adiabatic pulse.

10. The method as recited in claim 8, wherein a first rephasing magnetic field gradient is played out during each duration of time along a first gradient axis, a second rephasing magnetic field gradient is played out during each duration of time along a second gradient axis that is orthogonal to the first gradient axis, and a magnetic field gradient blip is played out during each duration of time along a third gradient axis that is orthogonal to the first and second gradient axes, such that the multichannel adiabatic pulse waveform defines a three-dimensional adiabatic pulse.

11. The method as recited in claim 8, wherein the multichannel adiabatic RF pulse refocuses transverse magnetization produced by generating an RF excitation pulse with the MRI system.

12. The method as recited in claim 11, wherein:

step (d) comprises generating an additional multichannel adiabatic RF pulse with the parallel transmit RF coil array by operating each coil using the provided different multichannel adiabatic RF pulse waveform for that coil;

step (e) comprises generating additional magnetic field gradients with the MRI system contemporaneously with the additional multichannel adiabatic RF pulse using the provided gradient waveforms and the provided rephasing gradient waveforms before acquiring the data in step (f);

and wherein the additional multichannel adiabatic RF pulse also refocuses the transverse magnetization produced by generating the RF excitation pulse with the MRI system.

* * * * *